(12) United States Patent
Dionne et al.

(10) Patent No.: US 6,460,692 B2
(45) Date of Patent: Oct. 8, 2002

(54) DUAL LANE CONVEYING APPARATUS

(75) Inventors: Peter J. Dionne; Koen Gieskes, both of Binghamton; Stanley Janisiewicz, Endwell, all of NY (US); Douglas A. Biesecker, Clark Summit, PA (US); Gary R. Thomas, Windsor, NY (US)

(73) Assignee: Delaware Capital Formation, Wilmington, DE (US)

( * ) Notice: Subject to any disclaimer, the term of this patent is extended or adjusted under 35 U.S.C. 154(b) by 24 days.

(21) Appl. No.: 09/742,337

(22) Filed: Dec. 22, 2000

(65) Prior Publication Data

US 2002/0079192 A1 Jun. 27, 2002

(51) Int. Cl.⁷ .............................................. B65G 21/20
(52) U.S. Cl. .................... 198/836.3; 198/890
(58) Field of Search .............................. 198/890, 890.1, 198/369.1, 456, 597, 861.3, 836.3

(56) References Cited

U.S. PATENT DOCUMENTS

| | | | | | |
|---|---|---|---|---|---|
| 3,554,353 A | * | 1/1971 | Raudat | .................... | 198/836.3 |
| 4,880,104 A | * | 11/1989 | Evans et al. | ......... | 198/836.3 X |
| 5,515,668 A | * | 5/1996 | Hunt et al. | .......... | 198/836.3 X |
| 5,730,579 A | * | 3/1998 | Keck et al. | ............. | 198/890 X |
| 6,209,707 B1 | * | 4/2001 | Ronchi | ................ | 198/836.3 X |

* cited by examiner

Primary Examiner—James R. Bidwell
(74) Attorney, Agent, or Firm—Burns, Doane, Swecker & Mathis, L.L.P.

(57) ABSTRACT

A dual lane board handling apparatus includes a first zone including first and second parallel pairs of rails extending in a first direction; a second zone including third and fourth parallel pairs of rails extending in the first direction; first tracks supporting the first and second pairs of rails so that the first and second pairs of rails can move on the first tracks in a second direction perpendicular to the first direction; a drive for moving the first pair of rails on the first tracks in the second direction such that the first pair of rails can be selectively moved between a first orientation wherein it is in alignment with the fourth pair of rails and a second orientation wherein it is in alignment with the third pair of rails; a drive for moving the second pair of rails in the second direction; and belts on the first, second, third, and fourth pairs of rails for conveying boards along the rails in the first direction.

35 Claims, 12 Drawing Sheets

DUAL LANE CONVEYING APPARATUS

BACKGROUND OF THE INVENTION

1. Field of the Invention

The present invention relates to a conveying apparatus for conveying flat panels, and in particular, relates to a dual lane conveying apparatus for conveying circuit boards along parallel paths. The apparatus can be used for conveying circuit boards through a robotic pick and place machine which mounts circuit elements on the circuit boards.

2. Discussion of Related Art

Conventional machines are known wherein a conveyor belt system conveys a printed circuit board through a robotic pick and place machine. After the conveyor system moves the printed circuit board to a specific location within the pick and place machine, robotic devices place electronic elements at predetermined locations on the printed circuit board. After the electronic elements have been placed on the printed circuit board, the conveyor system conveys the printed circuit board out of the pick and place machine. A known pick and place machine is sold by Universal Instruments, Inc. of Binghamton, N.Y., under the model number 4680A GSM.

In most machines, the conveyor system receives the printed circuit board at one side of the machine, and conveys it through the machine so that it can be populated with electronic elements. After the board is populated, the conveyor system conveys the board to the opposite side of the machine, where the board is discharged. However, in some applications, it may be desirable or necessary to discharge the populated circuit board from the same side of the machine from which it entered.

In some pick and place machines, two parallel lanes extend through the pick and place machine so that two boards may be conveyed simultaneously. One such dual lane conveyor system is illustrated schematically in FIGS. 1 and 2. Each lane of the system includes two horizontally spaced, parallel conveyor belts. For example, in FIG. 1, lane 1 includes conveyor belts 14, 16 and lane 2 includes conveyor belts 10, 12.

According to the drive mechanism of the prior art conveying system, there is only one drive mechanism for moving all of the conveyor belts. In other words, if the conveyor belts 10, 12 are moved, the conveyor belts 14, 16 are also moved.

In operation, electronic elements are typically populated on the circuit boards only within zone 2, i.e., while the boards are either in P1-2 or P2-2.

However, according to this conventional system, there are some inefficiencies. For example, the spacing between conveyor belts 10, 12 and the spacing between conveyor belts 14, 16 cannot be adjusted individually. In other words, the width of lane 1 must always be equal to the width of lane 2. In addition, conveyor belts 10, 12 cannot be operated independently of conveyors belts 14, 16. Accordingly, individual control of the boards is made difficult.

Furthermore, it is not possible to move a board from lane 1 to lane 2, or vice versa. Accordingly, the prior art conveyor system is not designed to allow the boards to be conveniently discharged from the same side of the machine that they entered.

SUMMARY AND OBJECTS

In view of some of the drawbacks of the conventional system described above, the present invention was developed to provide greater versatility to the heretofore known dual lane conveyor systems.

Advantages of the present invention include the ability to independently adjust the width of dual conveyor paths. The present invention also enables boards being conveyed to be switched from one lane to another. In addition, the present invention enables printed circuit boards to be conveniently loaded and discharged from the same side of a pick and place machine. Other advantages of the present invention will be apparent from the description that follows.

A dual lane board handling apparatus according to one aspect of the present invention includes a first zone including first and second parallel pairs of rails extending in a first direction; a second zone including third and fourth parallel pairs of rails extending in the first direction; first tracks supporting the first and second pairs of rails so that the first and second pairs of rails can move on the first tracks in a second direction perpendicular to the first direction; a drive for moving the first pair of rails on the first tracks in the second direction such that the first pair of rails can be selectively moved between a first orientation wherein it is in alignment with the fourth pair of rails and a second orientation wherein it is in alignment with the third pair of rails; a drive for moving the second pair of rails in the second direction; and belts on the first, second, third, and fourth pairs of rails for conveying boards along the rails in the first direction.

It will be appreciated that many modifications and variations of the present invention are possible in light of the teachings set forth herein, and within the purview of the appended claims without departing from the spirit and intended scope of the invention.

DETAILED DESCRIPTION OF EMBODIMENTS OF THE INVENTION

Figure 1:
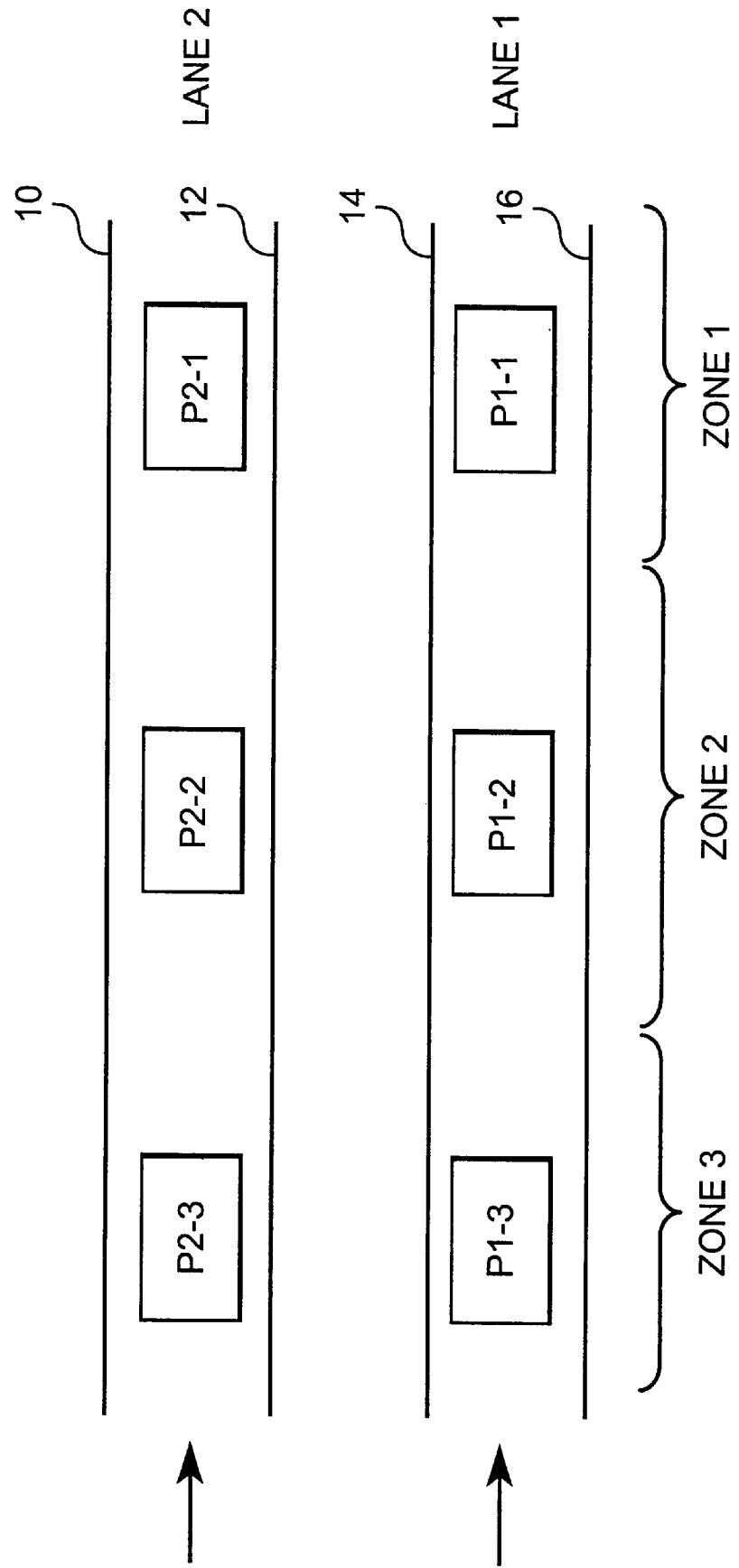
FIG. 1 illustrates a prior art method of conveying circuit boards.
Figure 2A:
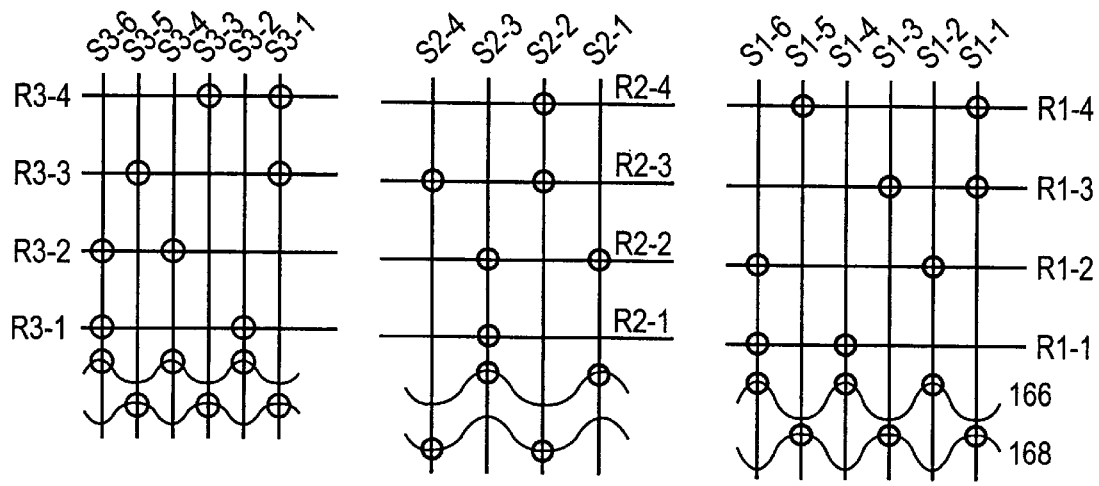
FIGS. 2A and 2B are schematic diagrams of a preferred embodiment of the present invention.

An embodiment of the present invention relates to a dual lane circuit board conveying system and is disclosed herein. The embodiment includes three different zones, hereinafter referred to as zones 1, 2, and 3 as illustrated in FIG. 2A. Some of the components of the embodiment will be defined with the use of a two part, i.e., hyphenated, reference numeral. In such a case, the first part of the numeral refers to the zone in which the component is located. For example, rail R2-1 refers to a first rail in zone 2.

Zone 1 and 3 Conveyor Rails

Figure 2B:
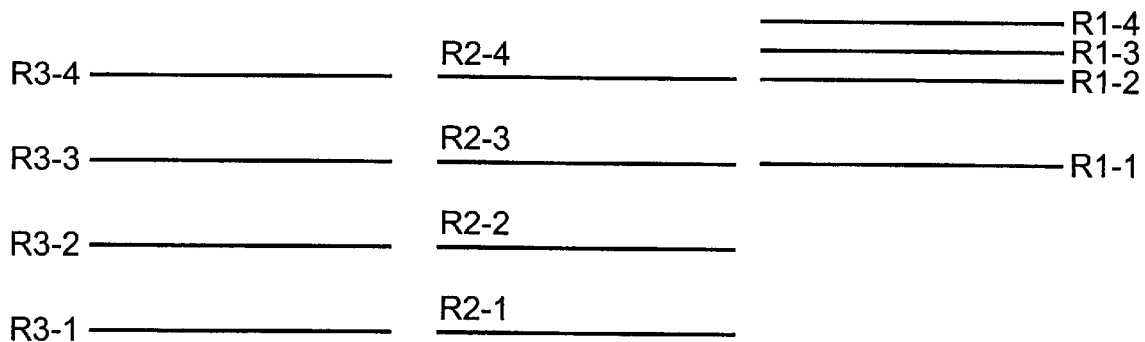

The dual lane conveying system of the present invention includes twelve rails R1-1, R1-2, R1-3, R1-4, R2-1, R2-2, R2-3, R2-4, R3-1, R3-2, R3-3, and R3-4. The rails are illustrated schematically in FIGS. 2A and 2B. Rails R1-1, R1-2, R1-3, and R1-4 are arranged in a first zone 1. Rails R2-1, R2-2, R2-3, and R2-4 are located in the middle zone 2. And, rails R3-1, R3-2, R3-3, and R3-4 are arranged on the left side in zone 3.

Each of the rails supports a conveyor. In an embodiment, the conveyor is a conveyor belt 178 (FIGS. 5 and 6), which will be described in detail later, for conveying printed circuit boards through the machine.

Figure 9:
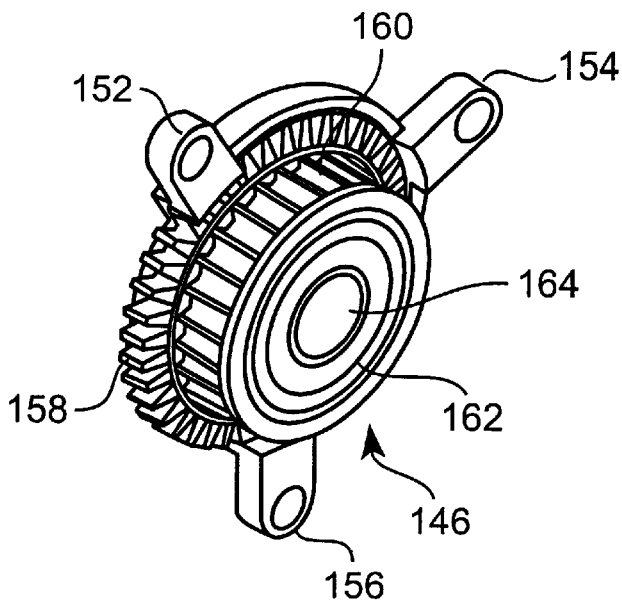
FIG. 9 is a perspective view of a drive pulley that is used in a preferred embodiment of the present invention.
Figure 10:
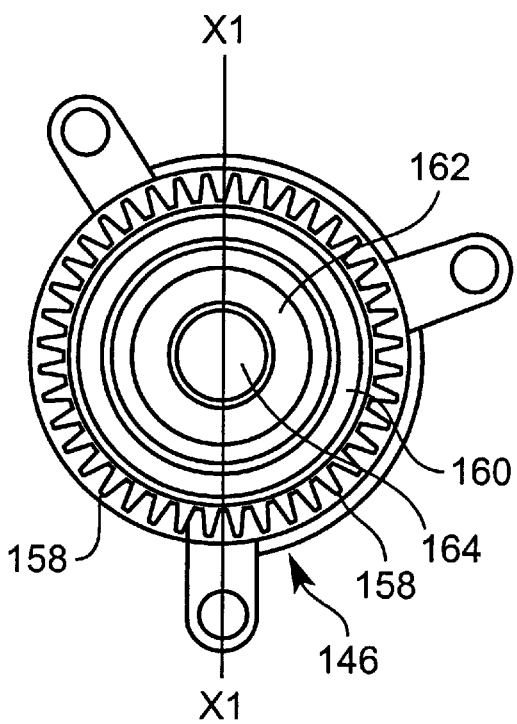
FIG. 10 is a front elevational view of the pulley illustrated in FIG. 9.
Figure 11:
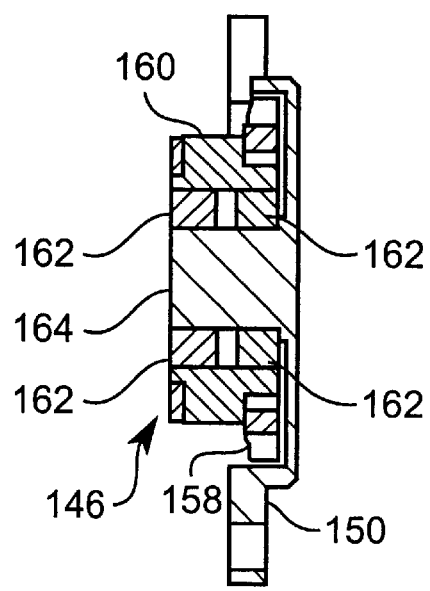
FIG. 11 is a cross-sectional view taken along line XI—XI of FIG. 10.
Figure 13:
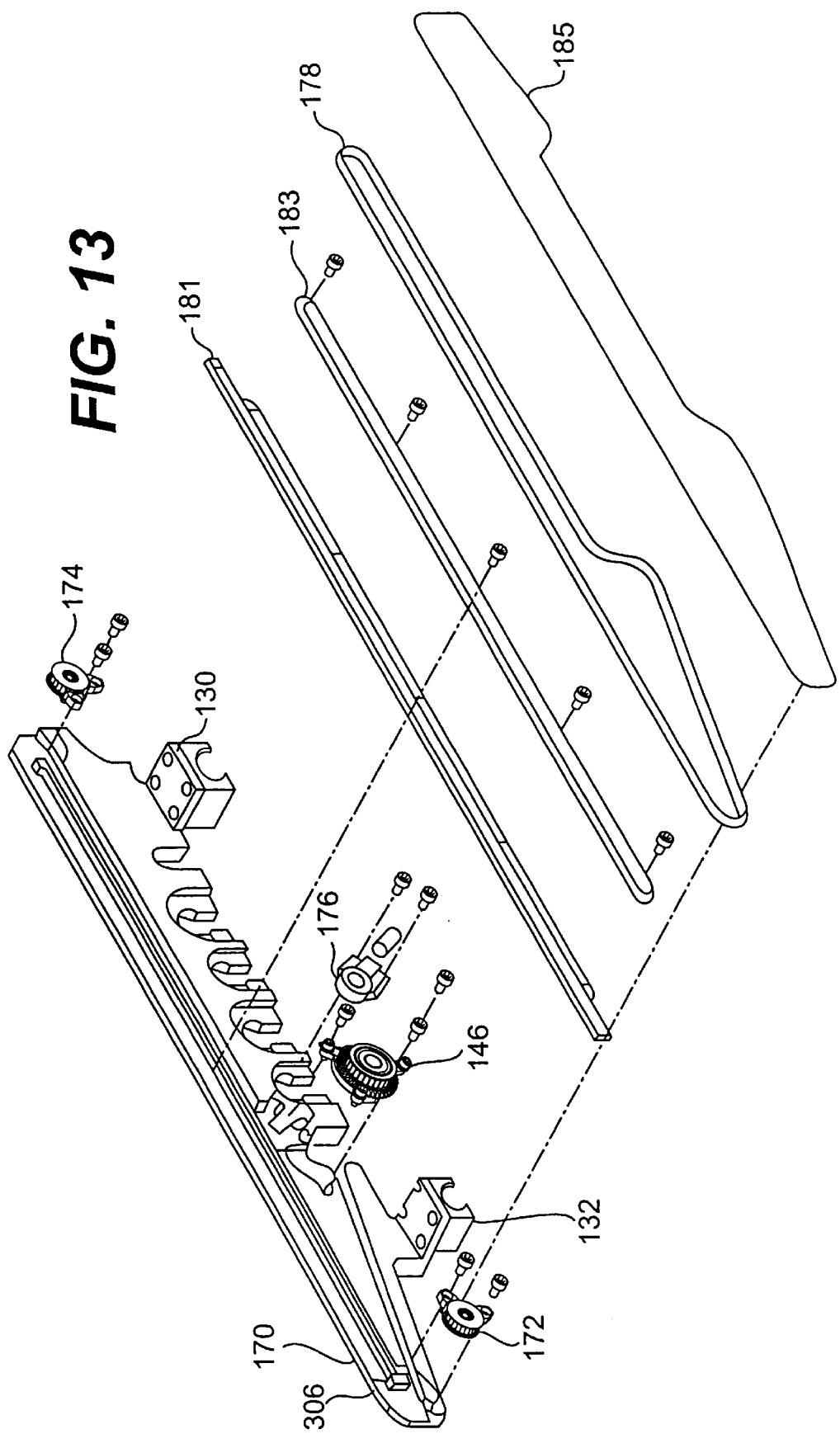
FIG. 13 is an exploded view of a shuttle rail that is used in a preferred embodiment of the present invention.

FIG. 13 is an exploded view of rail R1-2. The rail R1-2 includes a frame 170. Supported on the frame 170 are idler pulleys 172, 174, and 176. Also mounted on the frame 170 is a drive pulley 146, the details of which are set forth below. See FIGS. 9–11 for detailed views of the drive pulley 146. The conveyor belt 178 is supported by the idler pulleys 172, 174, 176, and is engaged with the drive pulley 146. An edge guide 181 is mounted to the frame 170 above the conveyor belt 178 to guide circuit boards being conveyed on the conveyor belts 178. A support plate 183 is also mounted to the frame 170 so as to support the underside of the conveyor belt 178. In addition, a cover plate 185 is also secured to the frame 170.

Referring to FIG. 2A, in zone 1, rails R1-1 and R1-2 comprise a first lane and rails R1-3 and R1-4 comprise a second lane that is parallel to the first lane.

Figure 3:
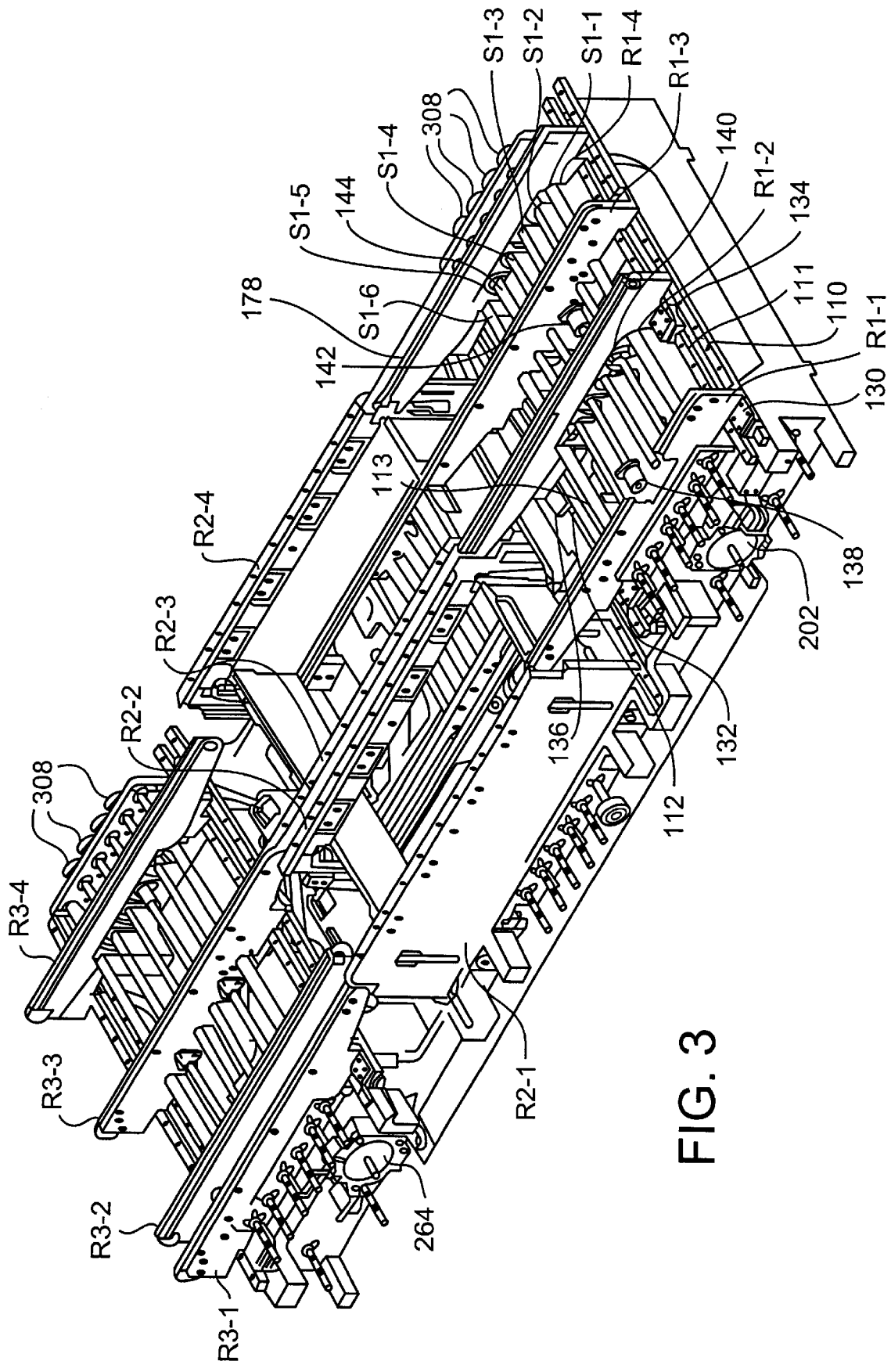
FIG. 3 is a perspective view of a preferred embodiment of the present invention.

There are four horizontally spaced, parallel tracks which support the four conveyor rails. In an embodiment, the tracks are bars 110, 111, 112, 113 that are arranged perpendicular to and below the conveyor rails R1-1, R1-2, R1-3, and R1-4, as best illustrated in FIG. 3. In alternative embodiments of the present invention, the rails can be supported by fewer or greater numbers of tracks. For example, the rails could be supported by one, two, three or more tracks.

Figure 4:
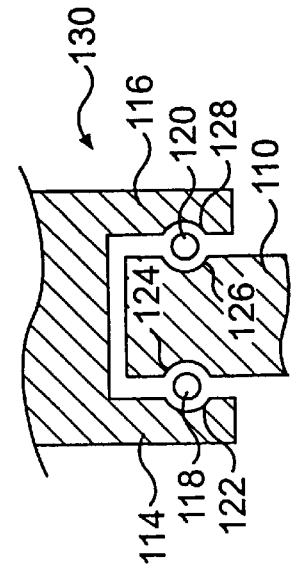
FIG. 4 is a cross-sectional view of a bearing that is used in a preferred embodiment of the present invention.

Attached at the base of one end of rail R1-1 is a linear bearing 130, a detailed cross-section of which can be seen in FIG. 4. The linear bearing 130 includes flanges 114, 116 which straddle the first bar 110. Complementary grooves 122, 124 and 126, 128 are formed in the respective flanges 114, 116 and the bar 110 and support ball bearings 118, 120. A similar linear bearing 132 is fixed at the base of the opposite end of the rail R1-1. The linear bearing 132 supports the rail R1-1 on the third bar 113. As a result of the linear bearings 130, 132, the rail R1-1 is able to translate along the bars 110, 113 with a minimal amount of friction.

A linear bearing 134, similar to linear bearing 130, is arranged at one end of rail R1-2. However, the linear bearing 134 at the base of rail R1-2 is slidably mounted on the second bar 111, which is parallel and adjacent to bar 110. In addition, a similar linear bearing 136 is arranged at the opposite end of rail R1-2 for supporting the rail R1-2 on the fourth bar 112. By supporting the rails R1-1 and rails R1-2 on different sets of bars 111, 112 and 110, 113, the two rails R1-1 and R1-2 can be moved very close to each other in a compact manner without having the linear bearings 130, 132, 134, 136 interfere with each other.

Rails R1-3 and R1-4 are also mounted on the bars 110, 111, 112, and 113 in a manner similar to that described above with respect to rails R1-1 and R1-2. However, as can be seen in FIG. 3, the linear bearings for rails R1-3 and R1-4 extend from the rails in the opposite direction as the linear bearings that are fixed on rails R1-1 and R1-2. The rails R3-1, R3-2, R3-3, and R3-4 of zone 3 are substantially the same as the rails R1-1, R1-2, R1-3, and R1-4 of zone 1.

Zone 1 and 3 Drive Mechanisms

As used in this description, "front" refers to the side of the machine facing the lower left corner of FIG. 3, and "back" refers to the side facing the upper right corner of FIG. 3. "Sideways" movement of the rails refers to movement of the rails from the front of the system, as shown in FIG. 3, to the back of the system, or vice versa. In other words, sideways movement of the rails is movement perpendicular to the longitudinal axes of the rails.

Figure 16:
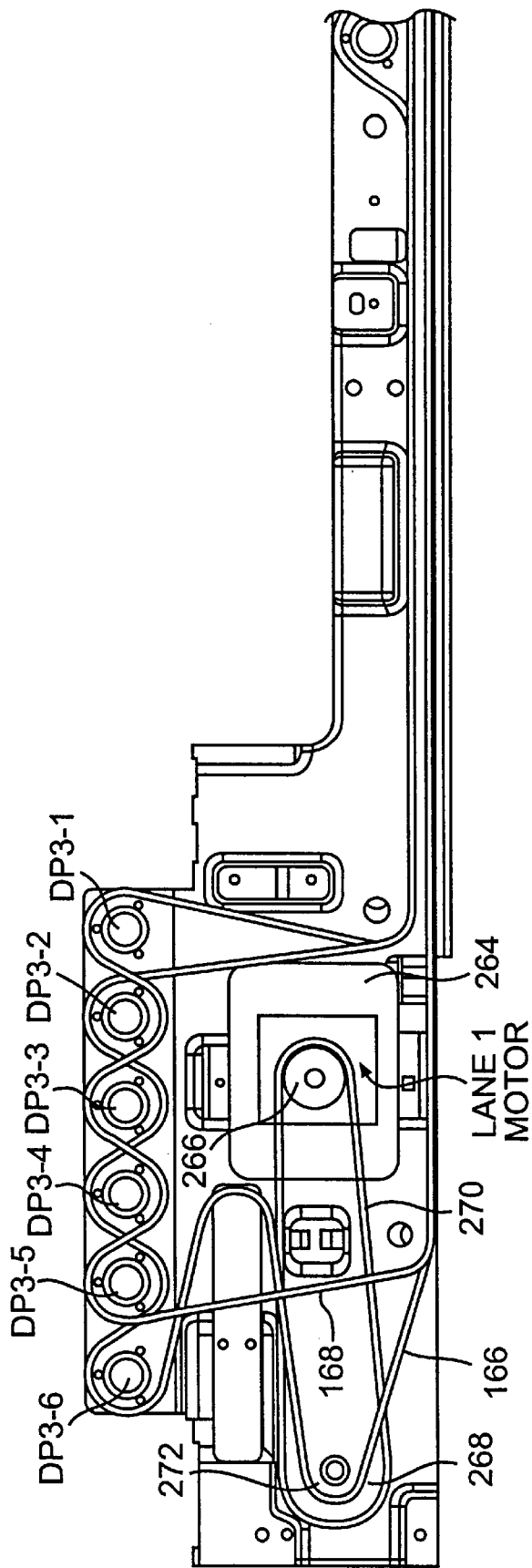
FIG. 16 is a view of a portion of the left side of a preferred embodiment of the present invention.
Figure 17:
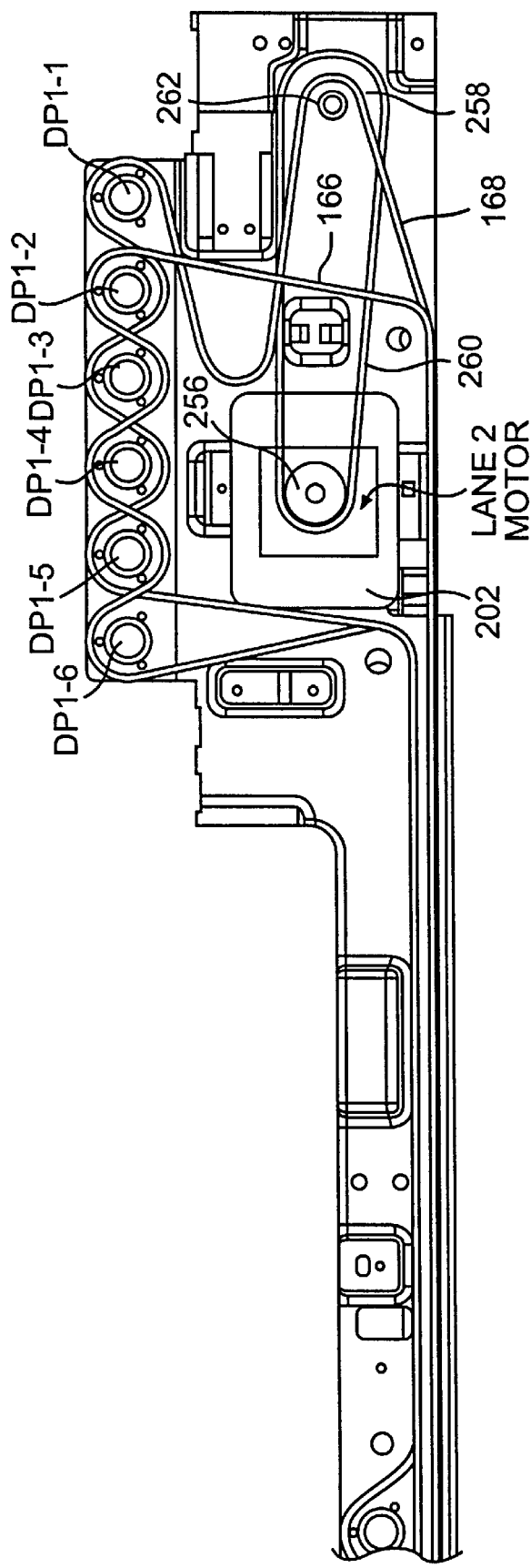
FIG. 17 is a view of a portion of the right side of a preferred embodiment of the present invention.

In one embodiment of the invention, the drive mechanism for zones 1 and 3 is illustrated in FIGS. 2A, 16, and 17. Arranged beneath the four rails R1-1, R1-2, R1-3, and R1-4 are six parallel shafts S1-1, S1-2, S1-3, S1-4, S1-5, and S1-6. The outer two shafts S1-1 and S1-6 are splined pinion shafts, whereas the inner four shafts S1-2, S1-3, S1-4 and S1-5 are threaded screw shafts.

The pinion shafts S1-1 and S1-6 are used to drive the conveyor belts 178 that are mounted on rails R1-1, R1-2, R1-3, and R1-4. The threaded shafts S1-2, S1-3, S1-4, and S1-5 are used to move the rails R1-1, R1-2, R1-3 and R1-4 sideways, i.e., in the direction of the threaded shafts.

A threaded nut 138 is fixed to the lower edge of the rail R1-1 and is threadedly engaged on the threaded shaft S1-4. Similarly, a threaded nut 140 is fixed to rail R1-2 and is threadedly mounted on shaft S1-2; a threaded nut 142 is fixed to rail R1-3 and is threadedly mounted on shaft S1-3; and, a threaded nut 144 is fixed to rail R1-4 and is threadedly mounted on shaft S1-5.

By rotating shaft S1-4 in a first direction, the rail R1-1 will move in a first sideways direction. And, rotating the shaft S1-4 in the opposite direction, will cause the rail R1-1 to move sideways in the opposite direction. Similarly, rotation of shaft S1-2 controls sideways movement of rail R1-2, rotation of shaft S1-3 controls sideways movement of rail R1-3, and rotation of shaft S1-5 controls the sideways movement of rail R1-4.

Pinion shaft S1-1 is connected to drive pulleys 146, one of which is mounted to rail R1-1, and the other of which is mounted to rail R1-2.

FIGS. 9–11 and 13 illustrate the drive pulleys 146. Each of the drive pulleys 146 has a frame 150 that includes three flanges 152, 154, 156 for mounting the drive pulley to its respective rail. The frame 150 includes a central hub 164. A gear 158 is mounted on a pulley 160, which is mounted on the hub 164 via bearings 162. The gear 158 is secured to the pulley 160 for rotation therewith, so that rotation of gear 158 causes rotation of the pulley 160.

A drive pulley 146 is mounted at the base of each of the rails R1-1, R1-2, R1-3, R1-4 so that the teeth of the gear 158 engage with the splines of one of the pinion shafts S1-1 or S1-6. Rotation of the respective pinion shaft causes rotation of the gear 158, which in turn causes rotation of the pulley 160.

A conveyor belt 178, the details of which are explained later, is engaged with the pulley 160 so that rotation of the pinion shaft drives the conveyor belt.

Rotation of the shaft S1-1 causes the drive pulleys 146 associated with rails R1-1 and R1-2 to rotate so that conveyor belts which are mounted on rails R1-1 and R1-2 can be driven in synchronization.

Similarly, pinion shaft S1-6 is connected to drive pulleys 146 on rail R1-3 and rail R1-4. The drive pulleys 146 are in turn connected to conveyor belts 178 mounted on rail R1-3 and rail R1-4. Accordingly, rotation of the splined pinion shaft S1-6 drives the conveyor belts on rails R1-3 and R1-4, in synchronization with each other.

At the front side of each of the shafts S1-1 through S1-6 is a respective drive pulley DP1-1, DP1-2, DP1-3, DP1-4, DP1-5, DP1-6, shown schematically in FIG. 17. The drive pulleys are connected to their respective shafts through a clutch mechanism, wherein when the clutch mechanism is disengaged, the drive pulley will rotate freely with regard to its respective shaft, and when the clutch is engaged, rotation of the drive pulley will rotate the respective shaft.

As can be seen in FIGS. 16 and 17, there is an inner drive belt 166 and an outer drive belt 168. The inner drive belt 166 is engaged with drive pulleys DP1-2, DP1-4, and DP1-6, which are connected to shafts S1-2, S1-4, and S1-6, respectively, through the abovementioned clutch mechanisms. Similarly, the outer drive belt 168 is engaged with drive pulley DP1-1, which is connected to shaft S1-1 through its respective clutch mechanism; to DP1-3, which is connected to shaft S1-3 through its respective clutch mechanism; and to DP1-5, which is connected to shaft S1-5 through its respective clutch mechanism.

Figure 6:
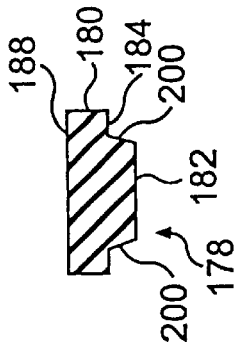
FIG. 6 is a cross-sectional view taken along line VI—VI of FIG. 5.
Figure 5:
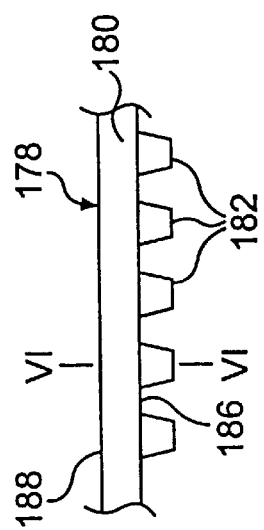
FIG. 5 is a side elevational view of a conveyor belt that is used in a preferred embodiment of the present invention.

The inner drive belt 166 and the outer drive belt 168 are similar in configuration to the conveyor belt 178 illustrated in FIGS. 5 and 6, except that the dimensions may be different. Specifically, the drive belts have a width of about 0.23 inches. The belts are made from urethane 80 shore D durometer M style vectran reinforcing cord. However, in alternative embodiments, the belts may be made from other materials known to those of skill in the art.

As a result of this arrangement, all of the functions associated with lane 1 in zone 1 of the system are driven by the inner drive belt 166, and all of the functions associated with lane 2 in zone 1 are controlled by the outer drive belt 168.

Specifically, the conveyor belts 178 on rails R1-1 and R1-2 are driven by the splined pinion shaft S1-6, which is controlled by the inner drive belt 166 engaging with drive pulley DP1-6 through its respective clutch mechanism.

In addition, sideways movement of rail R1-1 is controlled by the inner drive belt 166 engaging with drive pulley DP1-4, which engages with the threaded shaft S1-4. And, sideways movement of rail R1-2 is controlled by the inner drive belt 166 engaging with drive pulley DP1-2, which engages with the threaded shaft S1-2.

Accordingly, in a preferred embodiment, each pair of rails has a respective drive mechanism that includes drive shafts. Specifically, the drive mechanism for driving the rails R1-1 and R1-2 includes the shafts S1-4 and S1-2. In an alternative embodiment, the drive mechanism includes additional features, such as a drive belt and clutch mechanisms for selectively engaging the drive belt to the drive shafts. See, for example, the drive belt 166 and the drive pulleys DP1-2 and DP1-4.

Similarly, with regard to lane 2, the conveyor belts 178 on rails R1-3 and R1-4 are controlled by the outer drive belt 168 engaging with drive pulley DP1-1, which engages with the splined pinion shaft S1-1. In addition, sideways motion of rail R1-3 is controlled by the outer drive belt 168 engaging with drive pulley DP1-3 through its clutch mechanism to threaded shaft S1-3. In addition, sideways movement of rail R1-4 is controlled by the outer drive belt 168 engaging with drive pulley DP1-5, which engages with the threaded shaft S1-5 through its respective clutch mechanism.

The drive mechanism for zone 3 is substantially the same as the drive mechanism for zone 1.

As an alternative to the embodiment of the invention that is described above, which uses the threaded shafts to drive the rails, an alternative embodiment of the invention employs a belt drive system, wherein the rails are driven directly by belts, instead of the threaded shafts.

Figure 12:
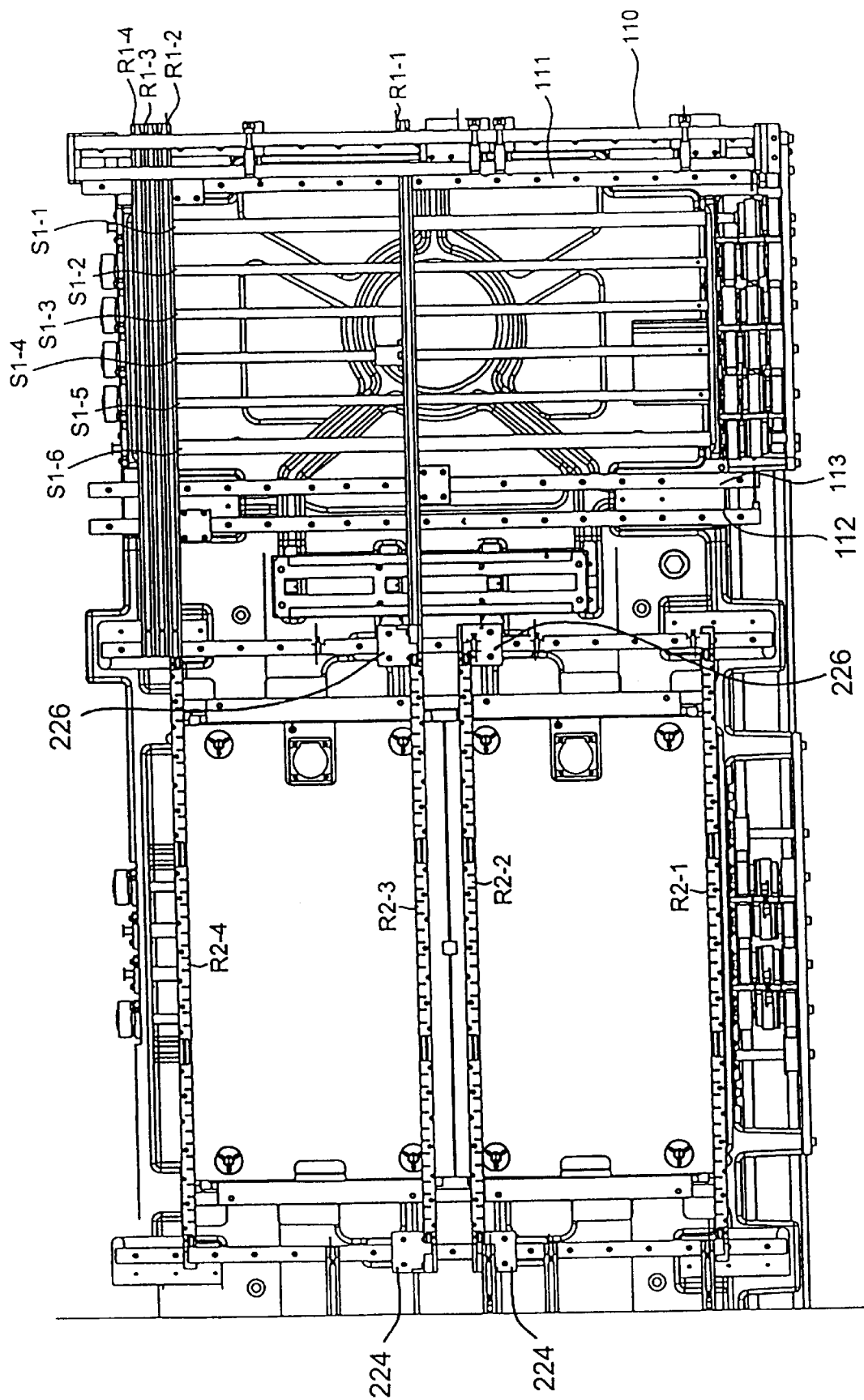
FIG. 12 is a top plan view of a portion of an embodiment of the present invention.

One advantage of the system of the present invention is that the rails can be moved sideways separately and individually. As a result, if desired, rails R1-3 and R1-4 can be moved completely to the back end of the machine, as illustrated in FIG. 12. Once rails R1-3 and R1-4 have been moved to the back end of the machine, rails R1-1 and R1-2 can also be moved toward the back of the machine so that rails R1-1 and R1-2 are in alignment with rails R2-3 and R2-4.

When rails R1-3 and R1-4 have been moved to the back end of the machine, and rails R1-1 and R1-2 are moved into alignment with rails R2-3 and R2-4, a board being conveyed along rails R1-1 and R1-2 can be transferred to rails R2-3 and R2-4. Thus, using the sideways movement of each of the rails, circuit boards can be moved from lane 1 in zone 1 to lane 2 in zone 2. Similarly, by sideways movements of the rails in zone 3, circuit boards traveling in lane 2 of zone 2 can be transferred to either lane 1 or lane 2 of zone 3.

Thus, by shuttling the rails, it is possible for circuit boards to easily change lanes. For example, if there is a problem in one lane, such as a stuck circuit board, operation of the system can continue by using the shuttle system to bypass the problem area.

Another advantage is that the system can be configured so as to enter and exit the circuit boards from the same side of the pick and place machine. Specifically, a new circuit board can enter the machine in lane 2 at zone 1. The board can then be conveyed to lane 2 in zone 2, where the board is populated. By shuttling the rails R3-1 and R3-2 in zone 3 to the back side of the machine, the board can be transferred to rails R3-1 and R3-2 in zone 3. Rails R3-1 and R3-2 can then be shuttled back to the front of the machine, whereat the conveyor belt s 178 on rails R3-1 and R3-2 can be reversed so that the board can be transferred to rails R2-1 and R2-2 in zone 2. From zone 2, the board can then be transferred to rails R1-1 and R1-2 in zone 1. Thus, the boards can be sequentially circulated through the system so that they can enter and exit from the same side.

As described above, the system is configured to pass a first board therethrough in lane 2, while a second board is being populated in lane 1, and vice versa. The system is further capable of being used in an existing single lane conveyor system line. In other words, the present invention can be used in a system that has a single lane input and a single lane output.

Conveyor Belts

Details of the conveyor belts 178 are illustrated in FIGS. 5 and 6. FIG. 5 is a side elevational view of the conveyor belt 178. The conveyor belt 178 includes a flat planar portion 180 with a plurality of teeth 182 extending from a lower side thereof. The top surface 188 of the planar portion 180 is substantially flat and is the surface which supports the printed circuit boards being conveyed.

As can be seen in the cross-sectional view illustrated in FIG. 6, the teeth 182 are not as wide as the planar portion 180, resulting in flat edge portions 184.

Figure 7:
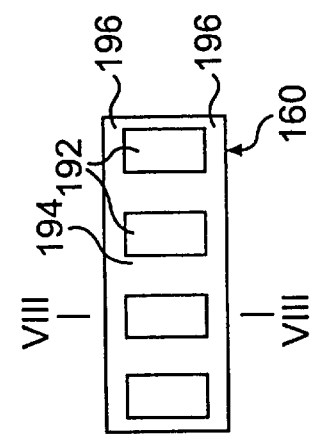
FIG. 7 is a top plan view of a pulley that is used in a preferred embodiment of the present invention.
Figure 19:
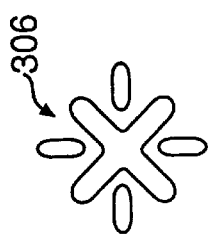
FIG. 19 is a view of a fiducial mark that is used in a preferred embodiment of the present invention.

FIG. 7 is a top elevational view of the pulley 160 which engages with the conveyor belt 178. As can be seen in FIG. 7, the pulley 160 includes a plurality of recesses 192 which align with the teeth 182 of the conveyor belt 178. The flat areas 186 between the teeth 182 on the conveyor belt 178 correspond to the lands 194 between the recesses 192 on the drive pulley 160.

Figure 8:
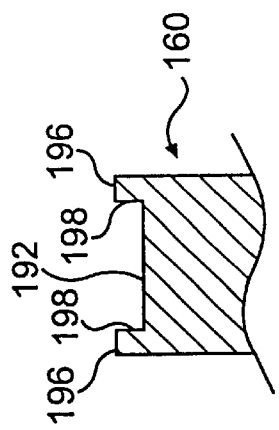
FIG. 8 is a cross-sectional view taken along line VIII—VIII of FIG. 7.

As can be seen in FIGS. 7 and 8, the pulley 160 includes flanges 196 on each edge of the recesses 192. The flanges 196 engage with the edge portions 184 of the conveyor belt 178. The side walls 198 of the flanges 196 engage with the side walls 200 of the teeth 182 of the conveyor belt 178. As a result of this engagement, the conveyor belt 178 is retained in alignment with the pulley 160. Because of this engagement, the conveyor belt 178 cannot move sideways with respect to the pulley 160.

Although FIGS. 7 and 8 illustrate a drive pulley 160, a similar concept and design is used for the idler pulleys 172, 174, 176 in order to prevent the conveyor belt 178 from sliding sideways off of the idler pulleys.

Zone 2 Rails

Figure 14:
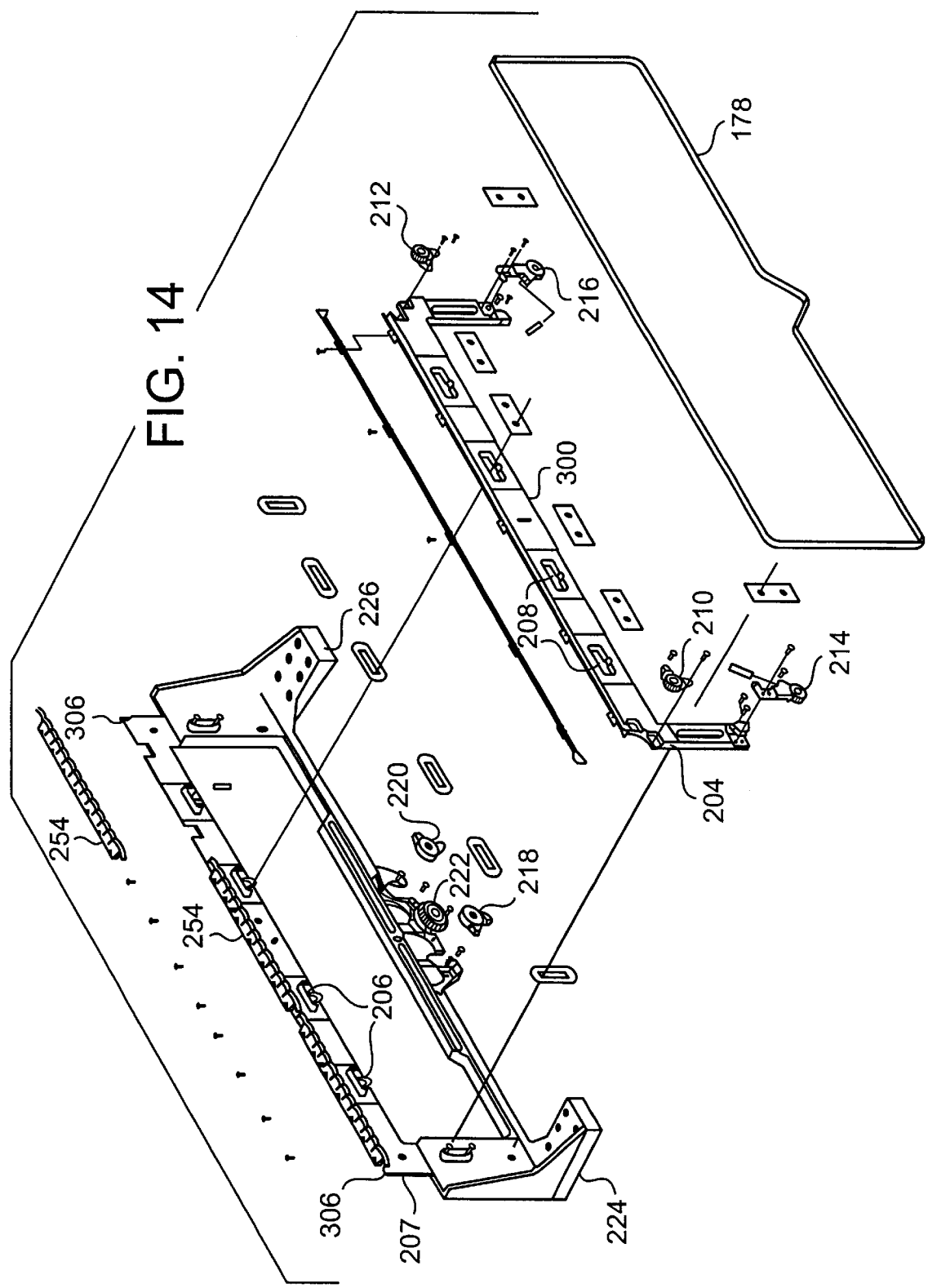
FIG. 14 is an exploded view of another rail that is used in a preferred embodiment of the present invention.

FIG. 14 illustrates rail R2-2. The rail R2-2 includes a base frame 207 which is mounted to the main frame of the system using linear bearings. A second or movable frame 204 is mounted on the base frame 207 in such a way that the movable frame 204 can move vertically with respect to the base frame 207. Guides 206 extending from the base frame 207 engage with slots 208 in the movable frame 204 to guide the movable frame 204 in the vertical direction with respect to the base frame 207. The movable frame 204 includes four idler pulleys 210, 212, 214, 216, around which a conveyor belt 178 is mounted. In addition, a drive pulley 222 and two idler pulleys 218, 220 are mounted to the base frame 207. The drive pulley 222 may be the same as, or similar to, the drive pulley 146 illustrated in FIGS. 9–11. The drive pulley 222 is mounted to the base frame 207 by means of flanges, and is arranged in such a manner that it engages with a splined pinion shaft S2-2 which extends in a direction transverse to the direction of the rail R2-2. Accordingly, rotation of the pinion shaft S2-2 causes rotation of the drive pulley 222, which in turn, engages with and drives the conveyor belt 178.

Rail R2-3 is substantially the same as rail R2-2, except that the drive pulley on rail R2-3 engages with a splined pinion shaft S2-2.

At the bottom of the base frame 207 are mounted linear bearings 224, 226, which engage with horizontal support bars to enable the rail R2-2 to move sideways along the support bars. The support bars are mounted in a lower part of zone 2, and extend perpendicular to the longitudinal direction of the rail R2-2. The linear bearings are the same as, or similar to, the linear bearing 130, illustrated in FIG. 4.

Figure 15:
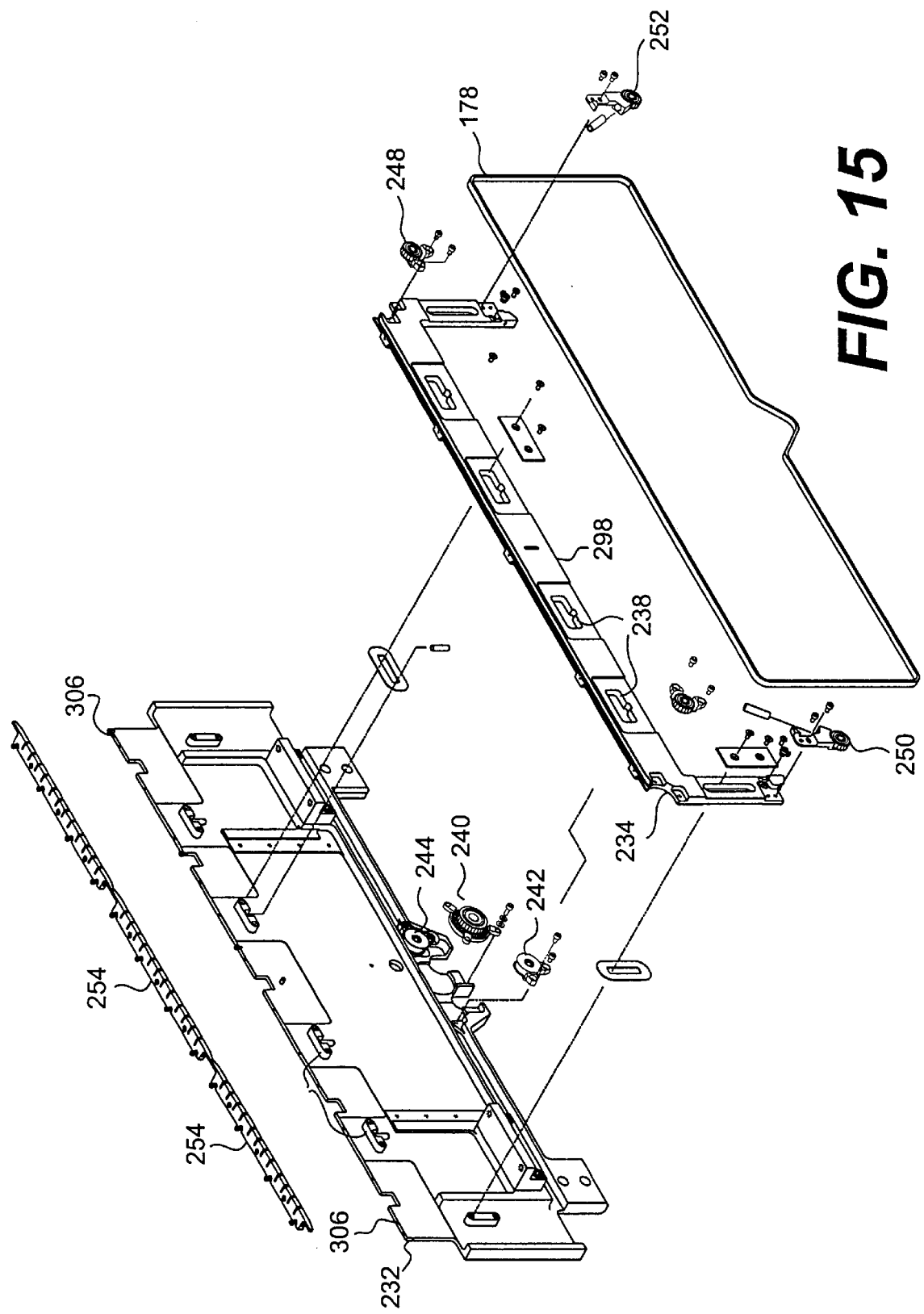
FIG. 15 is an exploded view of yet another rail that is used in a preferred embodiment of the present invention.

FIG. 15 illustrates rail R2-1, which in many respects is similar to rail R2-2. A primary difference between rail R2-1 and rail R2-2 is that the rail R2-1 is mounted to the frame of the system in a stationary manner, wherein the rail R2-2 is able to translate sideways along the machine.

Rail R2-1 includes a stationary frame 232, which is secured to the main frame of the system in a stationary manner. A second or movable frame 234 is mounted on the base frame 232 in such a way that the movable frame 234 can move vertically with respect to the base frame 232. Guides 236 extending from the base frame 232 engage with slots 238 in the movable frame 234 to guide the movable frame 234 in the vertical direction with respect to the stationary frame 232.

The movable frame 234 includes four idler pulleys 246, 248, 250, 252 around which a conveyor belt 178 is mounted. In addition, a drive pulley 240 and two idler pulleys 242, 244 are mounted to the base frame 232. The drive pulley 240 is the same as, or similar to, the drive pulley 146 illustrated in FIGS. 9–11. The drive pulley 240 is mounted to the base frame 232 by means of flanges, and is arranged in such a manner that it engages with the pinion shaft S2-3, which extends in a direction transverse to the direction of the rail R2-1. Accordingly, rotation of the pinion shaft S2-3 causes rotation of the drive pulley 240, which in turn, engages with and drives the conveyor belt 178.

Rail R2-4 is substantially the same as rail R2-1, except that the drive pulley on rail R2-4 engages with the shaft S2-2.

Accordingly, rotation of shaft S2-3 in a first direction drives the conveyor belts on rails R2-1 and R2-2 in the same direction. Similarly, rotation of the shaft S2-3 in the opposite direction causes the conveyor belts on rails R2-1 and R2-2 to operate in the reverse direction.

Splined pinion shaft S2-2 is parallel to S2-3 and similarly engages with drive pulleys on rails R2-3 and R2-4 to synchronously move conveyor belts on rails R2-3 and R2-4 in a manner similar to that described above with regard to rails R2-1 and R2-2.

The rail R2-2 includes a threaded nut that is fixed with regard to the rail, and is threadably mounted on a threaded shaft S2-1. Accordingly, rotation of the shaft S2-1 causes the rail R2-2 to translate along the length of the shaft S2-1.

Rail R2-3 is similar to rail R2-2 in that it is mounted on the transverse bars to enable the rail to be moved along the length of the shaft S2-4. A threaded nut is fixed to rail R2-3, and is threadably engaged with a threaded shaft S2-4 so that rotation of the shaft S2-4 causes the rail R2-3 to move along the length of the shaft S2-4.

In one embodiment of the invention, the outer rails in zone 2, R2-1 and R2-4, are fixed with regard to the frame of the machine and are thus not able to translate sideways.

Because the bars 110, 111, 112, and 113 extend outwardly from the back of the machine a distance beyond the location of the fixed rail R2-4, it is possible for the rails R1-3 and R1-4 to be moved sideways to the extent that they are on the backside of rail R2-4. See FIG. 12. Such movement enables rails R1-1 and R1-2 to be moved in alignment with rails R2-3 and R2-4.

At the forward end of shaft S2-1 is a drive pulley DP2-1. The drive pulley DP2-1 is connected to the shaft S2-1 by means of a clutch mechanism. Similarly, drive pulleys DP2-2, DP2-3, and DP2-4 are respectively mounted on shafts S2-2, S2-3, and S2-4, through respective clutch mechanisms.

The inner drive belt 166 is arranged so as to be in engagement with drive pulleys DP2-1 and DP2-3. The outer drive belt 168 is arranged so as to be in engagement with drive pulleys DP2-2 and DP2-4. Accordingly, rotation of shafts S2-2 and S2-4 can be effected by rotation of the outer drive belt 168 and the selected engagement of the clutch mechanisms associated with DP2-2 and DP2-4. Similarly, rotation of shafts S2-1 and S2-3 can be effected by rotation of the inner drive belt 166 and the selective engagement of the respective clutch mechanisms with drive pulleys DP2-1 and DP2-3.

A motor 202 is provided on the front face of zone 1. See FIG. 17. A pulley 256 is mounted on the drive shaft of the motor. Also mounted on the face of zone 1 is a corresponding pulley 258. A belt 260 connects the motor pulley 256 and the corresponding pulley 258. A second pulley 262 is also mounted on the shaft which supports pulley 258. The outer drive belt 168 is engaged with the second pulley 262. Thus, the belt 260 functions as a gear reducer between the motor 202 and the outer drive belt 168.

As can also be seen in FIG. 16, a motor 264 is mounted to the front face of zone 3. A pulley 266 is mounted on the shaft of the motor 264. Another pulley 268 is mounted also to the front face of zone 3. A belt 270 engages the pulley 266 of motor 264 with the corresponding pulley 268. Also mounted on the same shaft which supports the pulley 268 is another pulley 272. The inner drive belt 166 is mounted on the pulley 272. In this regard, the belt 270 functions as a gear reducer between the motor 264 and the inner drive belt 166.

In an alternative embodiment, a single motor is used instead of the two motors 202 and 264. In such an embodiment, the single motor is connected to the inner belt 166 and outer belt 168 through a dual clutch mechanism. In another alternative embodiment, more than two motors can be used instead of the two motors 202 and 264. In fact, a separate motor can be used for each shaft.

The robotic arms which populate the circuit boards on the rails approach the circuit boards from either the front or the back side of the conveying system. Thus, because the outer rails R2-1 and R2-4 are fixed, the outer rails are held at a location that is closest to the source of the electronic components. Accordingly, movement of the robotic arms is minimized.

Each of the drive belts 166, 168 includes a tension adjusting device so that the tension in the drive belt can be adjusted or regulated.

Zone 3

Zone 3 includes four rails R3-1, R3-2, R3-3, and R3-4. The zone 3 portion of the system is a substantial mirror opposite of the zone 1 portion, which includes rails R1-1, R1-2, R1-3, and R1-4. Accordingly, a detailed description of zone 3 is omitted. For a detailed understanding of zone 3, reference may be had to the foregoing description of the zone 1 portion of the system.

Circuit Board Clamping Mechanism

A clamping mechanism is provided to hold the printed circuit board steady while circuit components are added to it. The clamping mechanism includes a plurality of flexible fingers 254 secured to a top portion of the base frame 207 and the base frame 232. See FIGS. 14 and 15. The flexible fingers 254 extend over the respective conveyor belt 178 and are spaced slightly thereabove.

Figure 18:
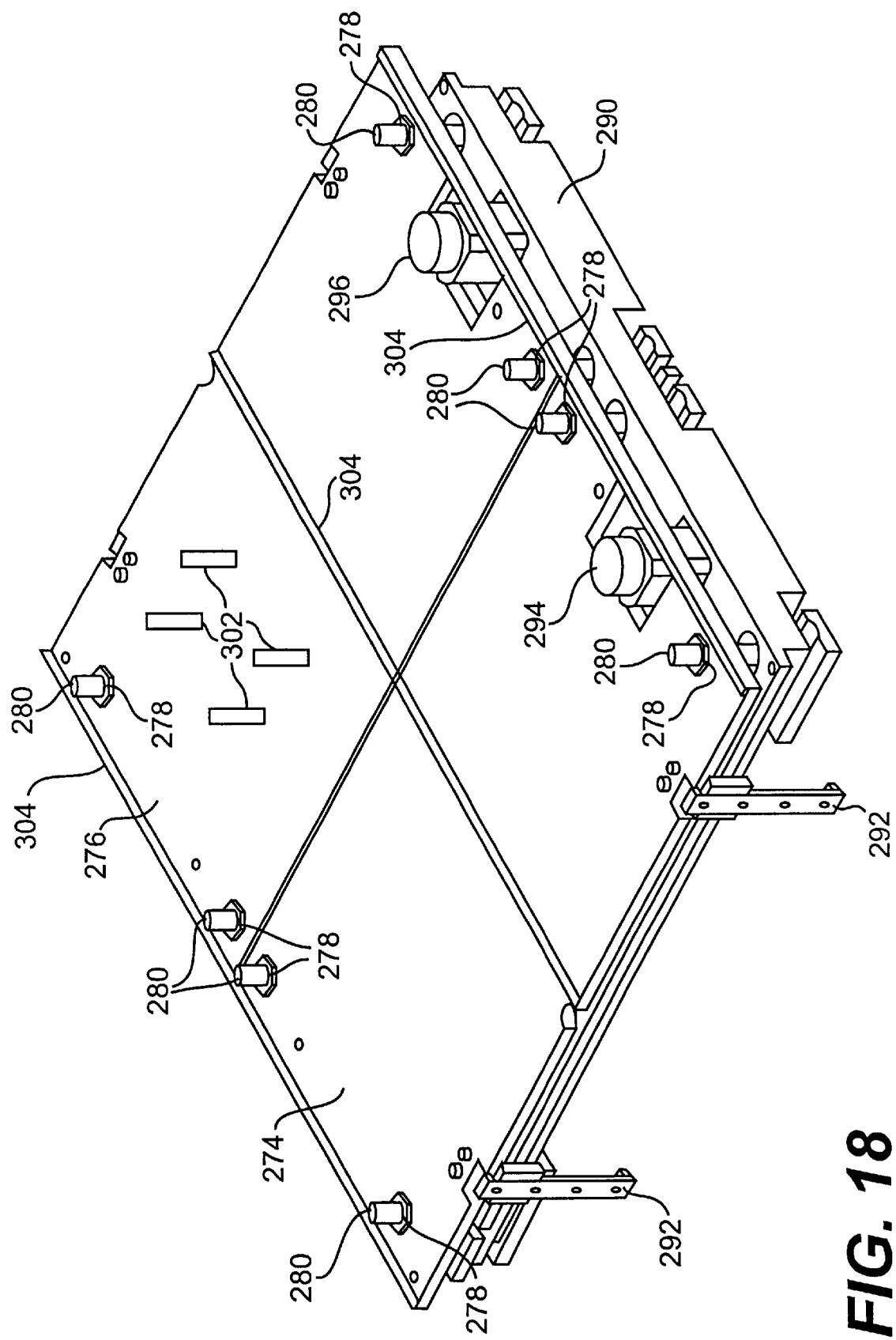
FIG. 18 is a perspective view of a board supporting system that is used in a preferred embodiment of the present invention.

As seen in FIG. 18, the clamping mechanism further includes two horizontal plates 274, 276, which are arranged adjacent to each other between rails R2-1 and R2-4. Plate 274 is in lane 1 and plate 276 is in lane 2. Each of the plates includes a threaded nut 278 in each corner thereof. The threaded nuts 278 are threadably engaged with corresponding vertical threaded screws 280 extending from the frame 290 of the system. Linear bearings 292 may be used to guide vertical movement of the plates.

Servo motors 294, 296, arranged in a center portion of each of the plates 274, 276 are connected to each of the threaded screws 280 by a drive belt (not shown) so that rotation of the respective servo motor drives the drive belt, and in turn rotates the four threaded screws 280 associated with the servo motor. Rotation of the threaded screws 280 causes the respective plate to move via the threaded nuts 278. Accordingly, the height of each of the plates 274, 276 is separately adjustable by the servo motors 294, 296.

When electronic components are to be added to a circuit board that is being conveyed by the present invention, it is preferable to steady the circuit board. The circuit board may be steadied by clamping the circuit board between the conveyor belts 178 and the flexible fingers 254. Such clamping is implemented by raising the appropriate plate 274, 276. Specifically, if the board is to be clamped in lane 2, plate 276 is raised by driving servo motor 296, which in turn rotates the threaded screws 280 associated with the plate 276. As explained above, rotation of the threaded screws 280, causes the plate 276 to rise. An edge of the plate 276 engages with a lower edge 298 of the movable frame 234 of rail R2-4. Simultaneously, an opposite edge of the plate 276 engages with the lower edge 300 of the movable frame 204 of rail R2-3. By raising the movable frames 204, 234, and the idler pulleys attached thereto, the respective conveyor belts 178 are also raised toward the flexible fingers 254 which are secured to the base frame 207, 232. As a result, the printed circuit board which is being conveyed on the conveyor belts 178 is effectively clamped between the conveyor belts 178 and the flexible fingers 254.

The plates 274, 276 may include ridges 304 running perpendicularly to the direction of the rails. As a result, it is the ridges 304 that contact with the lower edges 298, 300 of the rails. Thus, if there is debris, such as circuit elements, lying on the plate, only the ridges 304 will make contact with the rails, and the spacing between the plates and the rails will not be adversely affected.

In order to support a center section of a printed circuit board onto which components are being mounted, vertical pins 302 may be fixed to a center portion of the plates 274, 276. The height of the pins 302 is selected so as to approximate the top surface of the conveyor belts 178 arranged on the adjacent rails.

Thus, when the plate is raised by the respective servo motor, the top of the pins 302 engages a bottom surface of the printed circuit board and maintains the bottom surface of the printed circuit board at the same level as it is supported by the conveyor belts 178.

In one embodiment, a special nozzle or device may be utilized to select a plurality of pins 302 from a reservoir of support pins and to place the pins 302 on the appropriate plate 274, 276. Such automation allows for quick product changeover without the need to manually move the board support pins between products.

Such a system allows the board support pins 302 to be picked from a reservoir of support pins and placed on the plates 274, 276 by the special nozzle on a Flexjet placement head which is associated with the circuit element robotic placement apparatus of the pick and place machine in which the system of the present invention is to be used. Such an arrangement allows for the quick and automated changeover of the system between products. The automated placement of the pins has the further advantage in that, in some configurations, it may be difficult to manually access the plates in order to place the pins on them.

Pin sizes and locations can be preprogrammed into a control system by defining the circuit boards and circuits to be mounted thereon in three dimensions: length, width, and height. Pin locations, including a radius of acceptable positional error, can be entered or preprogrammed for each product changeover.

The system may also include a purge mode, during which all pins 302 are automatically removed and placed in their reservoir. The system may also include a validation mode, wherein the setup of the pins 302 can be validated with a visual inspection, such as by a Pattern Error Correction (PEC) camera, a downward looking camera affixed to the robotic placement apparatus of a pick and place machine, with which the present invention is to be used.

Calibration System

The system may also incorporate a calibration/setup mode. In such system, each of the movable rails R1-1, R1-2, R1-3, R1-4, R3-1, R3-2, R3-3, and R3-4 would include a fiducial marking 306 on the end thereof adjacent zone 2. Similar fiducial markings 306 would be located on each end of the rails R2-1, R2-2, R2-3, R2-4. See FIGS. 13, 14, 15, and 19. The fiducial markings 306 are detectable by a PEC camera included with the pick and place machine in which the conveyor system is to be used.

In addition, encoders 308 are mounted at the back side of each of the threaded shafts S1-2, S1-3, S1-4, S1-5, S2-1, S2-4, S3-2, S3-3, S3-4, and S3-5. Each encoder 308 will be able to detect the specific rotation of its respective shaft. Thus, by monitoring the encoder output, the amount of rotation of each shaft can be monitored.

According to the present invention, at a setup phase, the PEC camera or cameras will be used to bring each of the movable rails R1-1, R1-2, R1-3, R1-4, R3-1, R3-2, R3-3, and R3-4 to respective start positions. Alternatively, the PEC camera is configured to search for the fiducial markings 306 without moving any of rails R1-1, R1-2, R1-3, R1-4, R2-2, R2-3, R3-1, R3-2, R3-3, and R3-4. Once the fiducial markings have been found on each rail, the absolute positions of the rails in space are known and are correlated to the encoder readings. Then, during operation, the exact location of each rail can be determined by monitoring the outputs of the respective encoders 308. In other words, the locations of the shafts can be determined by monitoring the amount and direction of rotation of the shafts.

Control System

Each of the motors 202, 264, 294, 296 and each of the clutches described herein are controlled by a control system that can be implemented and programmed by one of ordinary skill in the art once the teachings of the present invention are understood. Such a control system typically includes a microprocessor programmed to provide control signals to accomplish the rail movements described herein. Accordingly, further details of the control system are not necessary for an understanding of the present invention and are thus omitted.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A dual lane board handling apparatus, comprising:
   a first zone including first and second parallel pairs of rails extending in a first direction;
   a second zone including third and fourth parallel pairs of rails extending in the first direction;
   first tracks supporting the first and second pairs of rails so that the first and second pairs of rails can move on the first tracks in a second direction perpendicular to the first direction;
   a first drive mechanism for moving the first pair of rails on the first tracks in the second direction such that the first pair of rails can be selectively moved between a first orientation wherein the first pair of rails is in alignment with the fourth pair of rails and a second orientation wherein the first pair of rails is in alignment with the third pair of rails;
   a second drive mechanism for moving the second pair of rails in the second direction; and
   a conveyor on each of the first, second, third, and fourth pairs of rails for conveying boards along the rails in the first direction.

2. The dual lane apparatus of claim 1, further comprising:
   a third zone including fifth and sixth pairs of rails extending in the first direction;
   second tracks supporting the fifth and sixth pairs of rails so that the fifth and sixth pairs of rails can move on the second tracks in the second direction perpendicular to the first direction;
   a fifth drive mechanism for moving the fifth pair of rails on the second tracks in the second direction such that the fifth pair of rails can be selectively moved between a first orientation wherein the fifth pair of rails is in alignment with the fourth pair of rails and a second orientation wherein the fifth pair of rails is in alignment with the third pair of rails;
   a sixth drive mechanism for moving the sixth pair of rails in the second direction; and
   a conveyor on the fifth and sixth pairs of rails for conveying boards along the rails in the first direction.

3. The dual lane apparatus of claim 2, wherein the respective drive mechanisms are configured to adjust a spacing between each of the pairs of rails.

4. The dual lane apparatus of claim 3, wherein the respective drive mechanisms can separately adjust the spacing between each of the pairs of rails.

5. The dual lane apparatus of claim 1, wherein the conveyors are conveyor belts.

6. The dual lane apparatus of claim 5, wherein the conveyor belts include a flat first surface and a second surface having teeth extending therefrom, wherein a width of the teeth is less than a width of the second surface from which the teeth extend.

7. The dual lane apparatus of claim 1, further comprising:
   third tracks for supporting the third and the fourth pairs of rails, wherein at least one of each of the third and fourth pairs of rails can be moved in the second direction;
   a third drive mechanism for moving the at least one of the third pair of rails in the second direction; and
   a fourth drive mechanism for moving the at least one of the fourth pair of rails in the second direction.

8. The dual lane apparatus of claim 2, further comprising a controller for controlling movement of the first drive mechanism, the second drive mechanism, the third drive mechanism, the fourth drive mechanism, the fifth drive mechanism, and the sixth drive mechanism, wherein each of the drive mechanisms can be controlled separately by the controller.

9. The dual lane apparatus of claim 1, wherein at least one of the rails comprises:
   a first frame;
   a second frame supported by the first frame and movable in a vertical direction with respect to the first frame;
   rollers on the second frame for supporting the respective conveyor;
   a motor for moving the second frame with respect to the first frame; and a contact above the conveyor, wherein a board being conveyed on the rail can be clamped between the conveyor and the contact by raising the second frame with respect to the first frame.

10. The dual lane apparatus of claim 2, wherein at least one of the rails of the third and fourth pairs of rails comprises:
a first frame;
a second frame supported by the first frame and movable in a vertical direction with respect to the first frame;
rollers on the second frame for supporting the conveyor;
means for moving the second frame with respect to the first frame; and
a contact above the conveyor, wherein a board being conveyed on the rail can be clamped between the conveyor and the contact by raising the second frame with respect to the first frame.

11. The dual lane apparatus of claim 9, further comprising a plate arranged between the pair of rails that includes the one rail, the plate including pins for supporting a board being conveyed by the pair of rails, wherein the plate moves in unison with the second frame so that a distance between a top of the pins and a top of the conveyor remains substantially constant.

12. The dual lane apparatus of claim 11, further comprising a robot for automatically placing support pins on the plate.

13. The dual lane apparatus of claim 1, wherein each of the third and fourth pairs of rails includes an inner rail and an outer rail, and further comprising a third drive mechanism for moving the inner rail of the third pair of rails in the second direction and a fourth drive mechanism for moving the inner rail of the fourth pair of rails in the second direction.

14. The dual lane apparatus of claim 13, wherein each of the outer rails of the third and fourth pairs of rails is not movable in the second direction.

15. The dual lane apparatus of claim 1, further comprising at least one motor for driving the first and second drive mechanisms.

16. The dual lane apparatus of claim 1, further comprising at least one motor for driving the first drive mechanism.

17. The dual lane apparatus of claim 16, further comprising a second motor for driving the second drive mechanism.

18. The dual lane apparatus of claim 17, wherein the at least one motor also drives the third and fifth drive mechanisms.

19. The dual lane apparatus of claim 18, wherein the second motor also drives the fourth and sixth drive mechanisms.

20. The dual lane apparatus of claim 1, further comprising:
at least one motor for driving the first and second drive mechanisms;
a sensor;
a marking on each of the first pair of rails, said markings being detectable by the sensor; and
a controller for calibrating the motor with regard to the location of the first pair of rails.

21. A method of conveying boards in a first direction with a dual lane apparatus having a first zone which includes first and second pairs of rails and a second zone which includes third and fourth pairs of rails, the method comprising the steps of:
aligning the first pair of rails in the first zone in a first position along a second direction;
delivering a board onto the first pair of rails;
realigning the first pair of rails in the first zone in a second position along the second direction, wherein the first pair of rails is in alignment with the fourth pair of rails in the second zone;
conveying the board along the first pair of rails toward the second zone; and
transferring the board from the first pair of rails to the fourth pair of rails.

22. The method of claim 21, wherein when the first pair of rails is in the first position, the first pair of rails is in alignment with the third pair of rails in the second zone.

23. The method of claim 21, further comprising the step of conveying the board along the fourth pair of rails.

24. A board conveyor, comprising:
a first rail, the first rail including a first section and a second section that is movable vertically with respect to the first section;
a second rail, the second rail including a first section and a second section that is movable vertically with respect to the first section;
idler pulleys on the second section of the first rail;
idler pulleys on the second section of the second rail;
a conveyor belt mounted on the idler pulleys of the first rail and a conveyor belt mounted on the idler pulleys of the second rail, wherein the two conveyor belts are parallel and are adapted to support a board;
a motor for driving the conveyor belts;
a flexible edge mounted on the first section of at least the first rail, the flexible edge being mounted over the conveyor belt on the first rail; and
a motor for raising the second section with respect to the first section of both the first rail and the second rail until a board supported on the conveyor belts is clamped firmly between the conveyor belts and the flexible edge.

25. The board conveyor of claim 24, further comprising a drive pulley on the first section of the first rail, wherein the conveyor belt is engaged with the drive pulley.

26. The board conveyor of claim 25, further comprising a plate arranged between the first rail and the second rail, the plate including pins for supporting the board being conveyed by the pair of rails, wherein the plate moves in unison with the second section of each of the rails so that a distance between a top of the pins and a top of the conveyor belt remains substantially constant.

27. A dual lane board handling apparatus, comprising:
a first zone including first and second parallel pairs of rails extending in a first direction;
first tracks supporting the first and second pairs of rails so that the first and second pairs of rails can move on the first tracks in a second direction perpendicular to the first direction;
a first drive shaft for moving at least one of the first pair of rails on the first tracks in the second direction;
a second drive shaft for moving at least one of the second pair of rails in the second direction;
a conveyor on each of the first and second pairs of rails for conveying boards along the rails in the first direction;
a third drive shaft for driving the conveyor on the first pair of rails;
a fourth drive shaft for driving the conveyor on the second pair of rails;
a first motor for driving the first and third drive shafts; and a second motor for driving the second and fourth drive shafts.

28. The dual lane apparatus of claim 27, further comprising:
a fifth drive shaft for driving another one of the first pair of rails; and
a sixth drive shaft for driving another one of the second pair of rails;
wherein the first motor also drives the fifth shaft and the second motor also drives the sixth shaft.

29. The dual lane apparatus of claim 28, wherein each of the drive shafts is connected to its respective motor by a clutch that can be selectively engaged and disengaged.

30. The dual lane board handling apparatus of claim 27, further comprising:
a second zone including third and fourth parallel pairs of rails extending in the first direction;
a seventh drive shaft for moving at least one of the third pair of rails in the second direction;
an eighth drive shaft for moving at least one of the fourth pair of rails in the second direction;
wherein the first motor also drives the seventh drive shaft and the second motor also drives the eighth drive shaft.

31. A dual lane conveying system, comprising:
first and second conveyors in a first zone;
third and fourth conveyors in a second zone;
fifth and sixth conveyors in a third zone;
wherein the first conveyor is aligned with the third conveyor in a first mode so that an object being conveyed thereon can be transferred from the first conveyor to the third conveyor, and in a second mode, the first conveyor is aligned with the fourth conveyor so that an object being conveyed thereon can be transferred from the first conveyor to the fourth conveyor; and
wherein the fifth conveyor is aligned with the third conveyor in a fifth mode so that an object being conveyed thereon can be transferred from the third conveyor to the fifth conveyor, and in a fourth mode, the fifth conveyor is aligned with the fourth conveyor so that an object being conveyed thereon can be transferred from the fourth conveyor to the fifth conveyor.

32. The dual lane conveying system of claim 31, wherein all of the conveyors are parallel to each other, and the three zones are in alignment with each other.

33. The dual lane conveying system of claim 31, wherein the first, third, and fifth conveyors are on a first side of the system and the second, fourth, and sixth conveyors are on a second side of the system, and further comprising:
a first motor for driving the first, third, and fifth conveyors; and
a second motor for driving the second, fourth, and sixth conveyors.

34. The dual lane conveying system of claim 33, wherein a width of each of the conveyors can be individually controlled.

35. The dual lane conveying system of claim 34, wherein the first motor controls the width of the first, third, and fifth conveyors, and the second motor controls the width of the second, fourth, and sixth conveyors.

* * * * *